(12) United States Patent
Linzer et al.

(10) Patent No.: US 6,927,710 B2
(45) Date of Patent: Aug. 9, 2005

(54) CONTEXT BASED ADAPTIVE BINARY ARITHMETIC CODEC ARCHITECTURE FOR HIGH QUALITY VIDEO COMPRESSION AND DECOMPRESSION

(75) Inventors: Elliot N. Linzer, Suffern, NY (US); Ho-Ming Leung, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 301 days.

(21) Appl. No.: 10/284,498

(22) Filed: Oct. 30, 2002

(65) Prior Publication Data

US 2004/0085233 A1 May 6, 2004

(51) Int. Cl.$^7$ .............................................. H03M 7/00
(52) U.S. Cl. ........................................................ 341/107
(58) Field of Search ........................ 341/107, 51, 106; 348/416

(56) References Cited

U.S. PATENT DOCUMENTS 5,933,105 A * 8/1999 Cho ............................ 341/107
6,549,148 B2 * 4/2003 Satoh ......................... 341/51

OTHER PUBLICATIONS

Joint Final Committee Draft of the Joint Video Specification (ITU-T Rec. H.264 ISO/IEC 14496-10 AVC), Sep. 19, 2002, pps. 1-197.

* cited by examiner

*Primary Examiner*—Brian Young
(74) *Attorney, Agent, or Firm*—Christopher P. Maiorana, P.C.

(57) ABSTRACT

A method for compressing/decompressing data, comprising the steps of translating a first representation of data to a second representation of the data and translating the second representation of the data to a third representation of the data.

22 Claims, 5 Drawing Sheets

CONTEXT BASED ADAPTIVE BINARY ARITHMETIC CODEC ARCHITECTURE FOR HIGH QUALITY VIDEO COMPRESSION AND DECOMPRESSION

FIELD OF THE INVENTION

The present invention relates to digital video compression generally and, more particularly, to a context based adaptive binary arithmetic coding (CABAC) encoder/decoder (CODEC) architecture for high quality video compression and decompression.

BACKGROUND OF THE INVENTION

Digital video data is compressed for many applications. Transmission over limited bandwidth channels such as direct broadcast satellite (DBS) and storage on optical media (i.e., CD, DVD, etc.) are typical examples. In order to achieve efficient compression, complex, computationally intensive processes are used for encoding (or compressing) and decoding (or decompressing) the digital video data. One conventional standard for compressing video is MPEG-2. However, other compression standards, such as H.264, are being developed. H.264 compression obtains high efficiency in compression. H.264 compression uses only 50–60% of the bit-rate used by MPEG-2 compression to provide the same quality of video.

Video data compression methods use some form of entropy coding. Motion vectors and other overhead such as transform coefficients are compressed using entropy coding. There are many types of well known entropy coding techniques, including Huffman coding and Context-based Adaptive Binary Arithmetic Coding (CABAC). For example, MPEG-2 uses Huffman encoding, whereas H.264 supports both Huffman and CABAC encoding. While CABAC is more efficient than Huffman encoding, CABAC uses significantly more processing power. This is particularly true for a real-time encoder or decoder that processes each picture in a bounded amount of time.

CABAC encoding and decoding is a multi-step, serial process. It is difficult to speed up the CABAC encoding and decoding process with parallel hardware. In high definition video, an entire second of compressed video data can be concentrated in one frame (i.e., one-thirtieth of a second). When the compressed video data is concentrated in one frame, the bit rate of the one second of compressed data is uneven. An uneven bit rate can make CABAC encoding and decoding difficult.

One conventional approach to the problem includes running the encoding/decoding hardware at a high frequency to handle the uneven bit rate problem. Disadvantages of the conventional approaches include high power consumption associated with high speed hardware. Also, frames can be dropped if the processing hardware cannot handle the data burst. High power devices are often not suitable for consumer products. In order to achieve the increased compression offered by CABAC, many sophisticated, processing intensive tools are used. Additionally, the hardware for encoding and decoding can be very complicated if parallel processing structures are implemented.

It would be desirable to provide a method for encoding and/or decoding a compressed video stream that uses an entropy encoding method in a manner that is well suited for low-cost, low-power, and/or real-time devices.

SUMMARY OF THE INVENTION

The present invention concerns a method for compressing/decompressing data, comprising steps of translating a first representation of data to a second representation of the data and translating the second representation of the data to a third representation of the data.

The objects, features and advantages of the present invention include providing a context-based adaptive binary arithmetic coding (CABAC) encoder/decoder (CODEC) architecture for high quality video compression and decompression that may (i) provide stand-alone logic to decode and/or encode a CABAC compressed bit-stream ahead of or behind a main video processing unit, (ii) process a number of frames ahead of a current frame during the decoding process, (iii) process a number of frames behind the current frame during the encoding process, (iv) buffer about one second of a compressed bit-stream, (v) store bits to be encoded in a buffer, (vi) store bits in an intermediate format to a buffer, (vii) receive a bit-stream in an intermediate format from a buffer, (viii) provide an intermediate format with configurable options including balanced buffer size, memory bandwidth and/or implementation complexity settings, (ix) operate at an average bit rate of a channel (rather than at the peak rate of bits per picture), (x) be implemented without complicated parallel hardware, (xi) encode or decode a high definition CABAC bit-stream at a low clock frequency, and/or (xii) store data in an intermediate bit-stream format to reduce the memory bandwidth.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
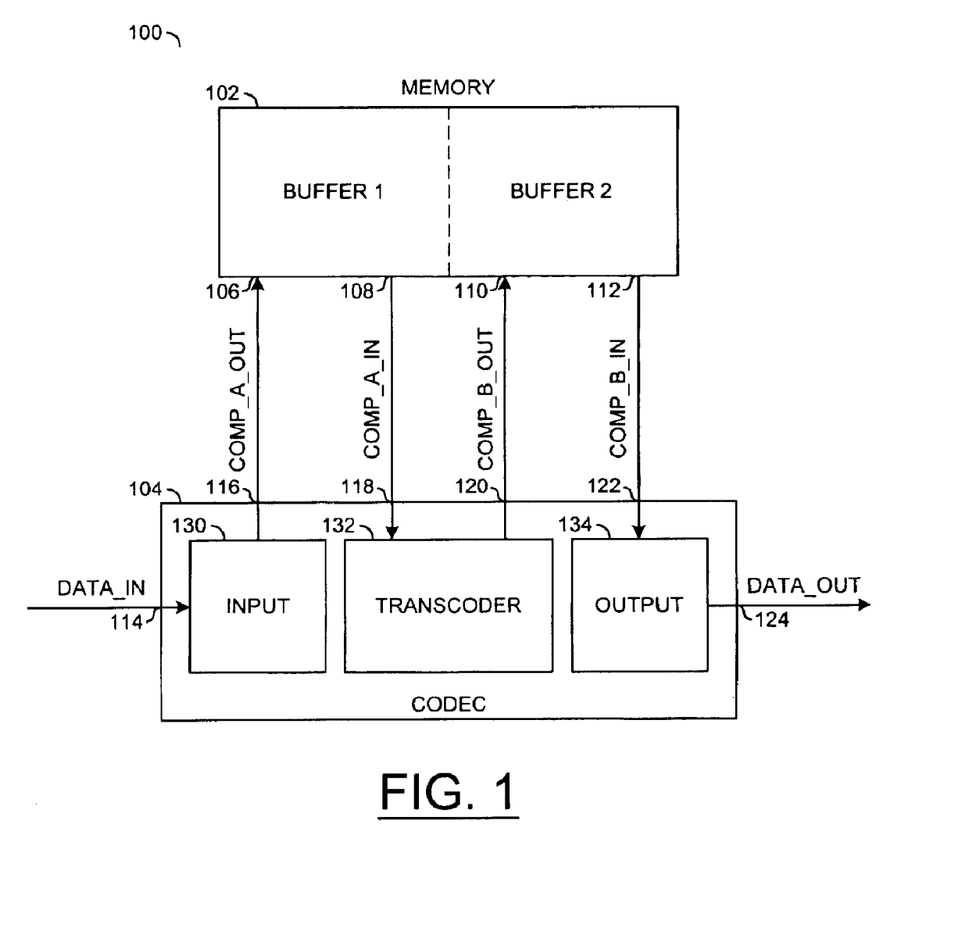
FIG. 1 is a block diagram of a preferred embodiment of the present invention.

Referring to FIG. 1, a block diagram of a circuit 100 is shown illustrating a preferred embodiment of the present invention. The circuit 100 generally provides an encoder/decoder architecture for high quality video compression and decompression that may be configured to use context-based adaptive binary arithmetic coding (CABAC). The circuit 100 generally receives an input signal (e.g., DATA_IN) and generates an output signal (e.g., DATA_OUT). When the circuit 100 is implemented as an encoder circuit, the signal DATA_IN may comprise uncompressed data (e.g., video, audio, etc.) to be compressed and the signal DATA_OUT may comprise a compressed data (or bit) stream (e.g., for transmission or storage). When the circuit 100 is implemented as a decoder circuit, the signal DATA_IN may comprise a compressed data (or bit) stream (e.g., MPEG-4, H.264, etc. compressed video) and the signal DATA_OUT may comprise an uncompressed data stream (e.g., video, audio, data, etc.).

The circuit 100 generally comprises a circuit 102 and a circuit 104. The circuit 102 may be implemented as a memory circuit. The circuit 104 may be implemented as an encoder, a decoder or an encoder/decoder (CODEC) circuit (or block). The circuit 102 may comprise a first portion (e.g., BUFFER1) and a second portion (e.g., BUFFER2). In one example, BUFFER1 and BUFFER2 may be implemented as sections of a single memory device. Alternatively, BUFFER1 and BUFFER2 may be implemented as individual memory devices. In one example, BUFFER1 and BUFFER2 may be implemented as first-in first-out (FIFO) memories.

The circuit 102 may have an input 106 that may receive a signal (e.g., COMP_A_OUT), an output 108 that may present a signal (e.g., COMP_A_IN), an input 110 that may receive a signal (e.g., COMP_B_OUT), and an output 112 that may present a signal (e.g., COMP_B_IN). The signals COMP_A_OUT and COMP_A_IN may communicate a first representation of data compressed in a first format (e.g., Huffman coding, CABAC, H.264, etc.). The circuit 102 may be configured to receive the compressed data in the first format via the signal COMP_A_OUT, store the data, retrieve the data and present the compressed data via the signal COMP_A_IN. The circuit 102 may be configured to store the compressed data received via the signal COMP_A_OUT in BUFFER1.

The signals COMP_B_OUT and COMP_B_IN may comprise a second representation of data, compressed using a second compression format (e.g., Huffman coding, CABAC, H.264, etc.). The circuit 102 may be configured to store the compressed data received via the signal COMP_B_OUT in BUFFER2. The circuit 102 may be configured to present the compressed data stored in BUFFER2 via the signal COMP_B_IN.

The circuit 104 may have an input 114 that may receive the signal DATA_IN, an output 116 that may present the signal COMP_A_OUT, an input 118 that may receive the signal COMP_A_IN, an output 120 that may present the signal COMP_B_OUT, an input 122 that may receive the signal COMP_B_IN, and an output 124 that may present the signal DATA_OUT. The circuit 104 may be configured to generate the signal COMP_A_OUT in response to the signal DATA_IN. The circuit 104 may be configured to generate the signal COMP_B_OUT in response to the signal COMP_A_IN. The circuit 104 may be configured to generate the signal DATA_OUT in response to the signal COMP_B_IN. The circuit 104 may be configured to generate one or more control signals for controlling the data flow to and from the circuit 102.

The circuit 104 generally comprises a circuit 130, a circuit 132 and a circuit 134. The circuit 130 may be implemented as an input circuit. The circuit 132 may be implemented as a transcoder circuit. The circuit 134 may be implemented as an output circuit. In one example, the circuit 130 may be implemented as a bit-stream capture unit. Alternatively, the circuit 130 may be implemented as a video encoding circuit.

In one example, the circuit 132 may be configured to translate data between a first representation of data (e.g., a context-based adaptive binary arithmetic coding scheme) and a second representation of the data (e.g., a simpler entropy coding scheme, such as Huffman, non-CABAC H.264, etc.). Alternatively, the circuit 132 may be configured to translate data from the simpler entropy coding scheme into the context-based adaptive binary arithmetic coding scheme. For example, the circuit 132 may be configured to translate directly from the context-based adaptive binary arithmetic coding scheme to a simpler entropy coding scheme (e.g., Huffman coding or non-CABAC encoding scheme). In one example, two formats may be implemented for the simpler compressed format: a) binarized but not CABAC and/or b) Huffman for coefficients and binarized but not CABAC for the rest. The first may be symbols that use the same variable-length binarization as H.264 CABAC but without arithmetic coding. The second format may be a H.264 representation using the Huffman (e.g., not CABAC) option for entropy encoding.

In general, the circuit 132 comprises a lossless entropy transcoder. Entropy encoding generally refers to representing a set of symbols in a way that the symbols can be exactly recovered from the representation. Furthermore, based on a statistical model, the representation generally uses, on average, fewer bits than the direct way of representing the data. The circuit 132 generally performs an entropy decode (e.g., a Huffman decode, a CABAC decode, etc.) on the signal COMP_A_IN and an entropy encode on the result of the decode operation (e.g., with a Huffman encode, CABAC encode, non-CABAC encode, etc.) for presentation as the signal COMP_B_OUT.

The circuit 134 may be implemented, in one example, as a real time video decoder circuit. In this example, the circuit 134 generally comprises a variable length code (VLC) decoder, dequantisation unit, and inverse transform unit that can be used to reconstruct pictures from a compressed bit stream. In a second example, the circuit 134 may be implemented as a real time video decoder. In the second example, the circuit 134 may be implemented as video transmission unit.

Figure 2:
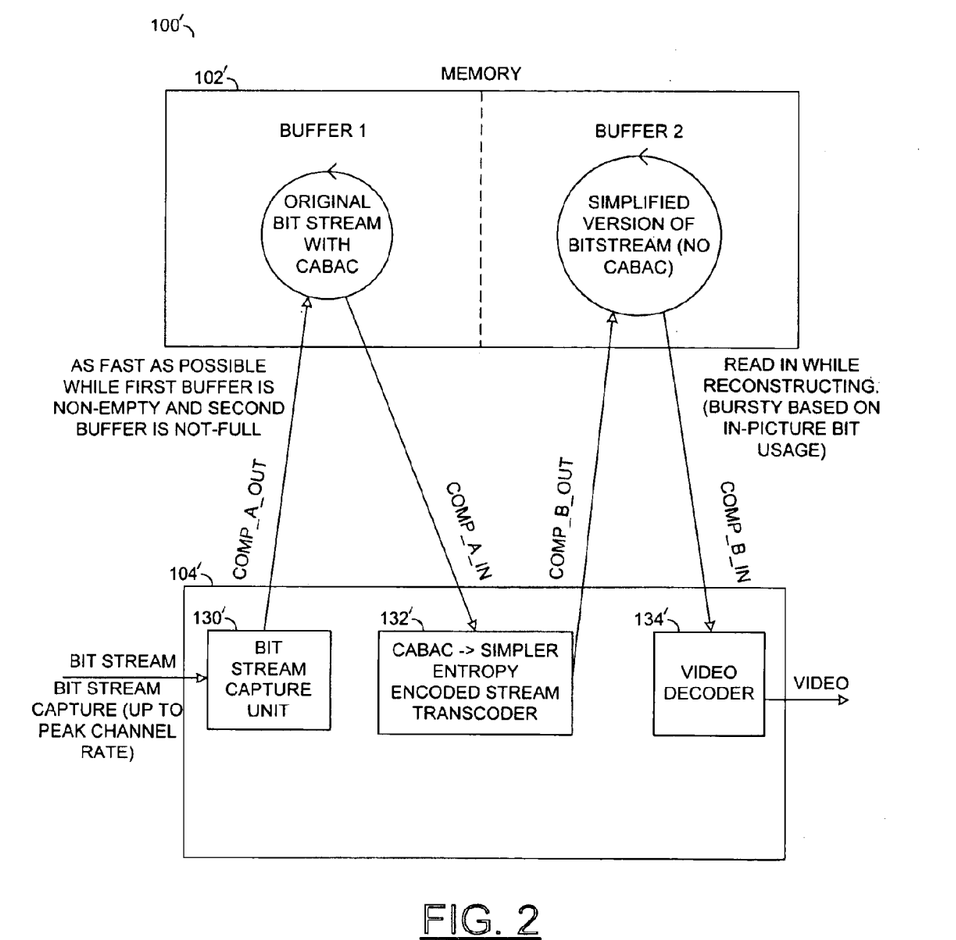
FIG. 2 is a block diagram of a decoder architecture/process in accordance with a preferred embodiment of the present invention.

Referring to FIG. 2, a block diagram of a circuit 100' is shown illustrating a decoder application in accordance with a preferred embodiment of the present invention. In one example, the circuit 100' may comprise a single integrated circuit (IC) decoder 104' and an external memory 102'. The circuit 102' may be implemented similarly to the circuit 102. The circuit 104' may comprise a circuit 130', a circuit 132' and a circuit 134'. The circuit 130' may be implemented as a bit-stream capture unit. The circuit 132' may be implemented as a transcoder circuit. The circuit 134' may be implemented as a real-time video decoder circuit.

The circuit 130' may be configured to receive a compressed data bit-stream (e.g., a signal BITSTREAM) and store the bit-stream in a first buffer implemented in the memory 102'. The circuit 132' may be configured to (i) retrieve the bit-stream from the memory 102', (ii) convert encoded data (e.g., encoded with CABAC) into a simpler encoded bit-stream (e.g., without CABAC) and (iii) store the simpler encoded bit-stream into a second buffer implemented in the memory 102'. The circuit 134' may be configured to (i) retrieve the simpler encoded bit-stream from the second buffer and (ii) decode the bit-stream, in one example, into video stream (e.g., a signal VIDEO). The circuit 130' is generally configured to store the bit-stream as fast as possible while the first buffer is non-empty and the second buffer is not full. Data is generally read from the second buffer while being reconstructed. In general, the second buffer may be sized to hold approximately 1 second of video. The data from the second buffer may be bursty based on, for example, in-picture bit usage.

Figure 3:
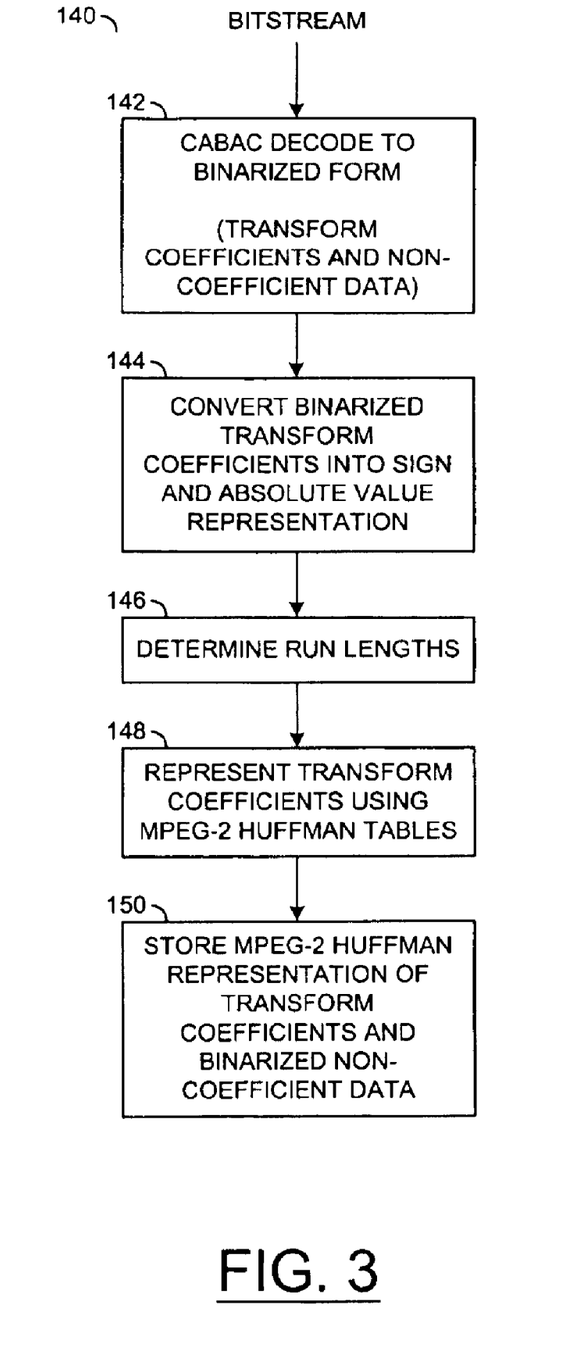
FIG. 3 is a flow diagram illustrating an example transcoding process in accordance with a preferred embodiment of the present invention.

Referring to FIG. 3, a flow diagram 140 illustrating an example operation of the circuit 132' of FIG. 2 is shown. The CABAC encoded bit-stream may be retrieved from the buffer and decoded to a binarized form (e.g., the block 142). The binarized form may comprise transform coefficients and non-coefficient data. The binarized transform coefficients may be converted into a sign and absolute value representation (e.g., the block 144). The absolute value representations may use a fixed number of bits (e.g., 12). The coefficients may be broken down into a significance map. The significance map may be used to determine run lengths for the coefficients. The sign and absolute value representations and the run lengths may be used to represent the transform coefficients by applying MPEG-2 Huffman code tables (e.g., the block 148). The MPEG-2 Huffman representations of the transform coefficients and the binarized non-coefficient data which resulted from the CABAC decoding step 142 may be stored in a buffer (e.g., the block 150). The non-coefficient data may include motion vector differences, macroblock headers as well as other data. In an alternative embodiment, the binarized form resulting from the CABAC decode (e.g., the block 142) may be sent to a buffer. In general, the result from the CABAC decode is a compressed representation. However, the compression is generally less than the bit-stream input to the CABAC decoder.

Figure 4:
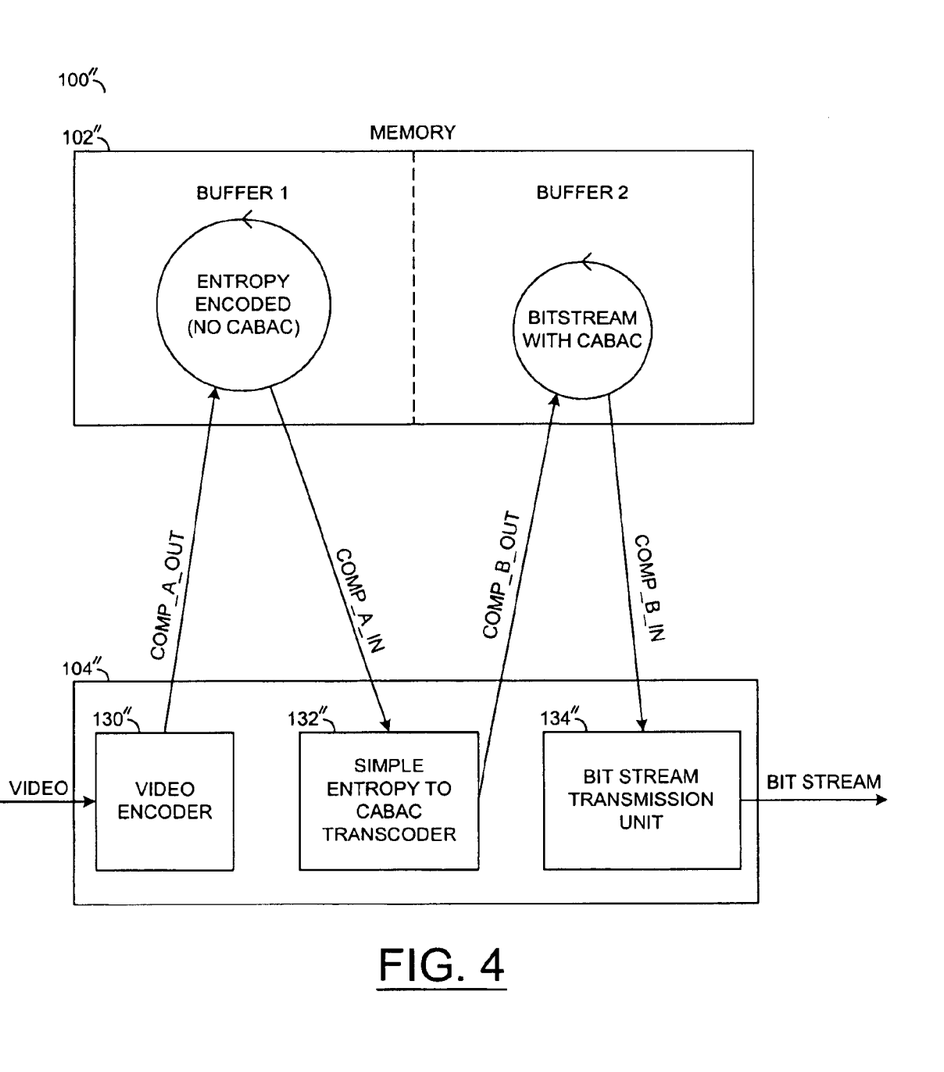
FIG. 4 is a block diagram of an encoder architecture/process in accordance with a preferred embodiment of the present invention.

Referring to FIG. 4, a block diagram of a circuit 100" is shown illustrating an encoder application in accordance with a preferred embodiment of the present invention. In one example, the circuit 100" may comprise a single integrated circuit (IC) decoder 104" and an external memory 102". The circuit 102" may be implemented similarly to the circuit 102. The circuit 104" may comprise a circuit 130", a circuit 132" and a circuit 134". The circuit 130" may be implemented, in one example, as a real-time video encoder. The circuit 132" may be implemented as a transcoder circuit. The circuit 134" may be implemented as a bit-stream transmission unit.

The circuit 130" may be configured to (i) receive an uncompressed video stream, encode the video stream with, for example, entropy coding (e.g., Huffman, universal variable length code (UVLC), etc.), and (iii) store the encoded data stream in a first buffer implemented in the memory 102". The circuit 132" may be configured to (i) retrieve the encoded data from the memory 102", (ii) convert encoded data (e.g., with no CABAC) into a more compact encoded bit-stream (e.g., with CABAC) and (iii) store the further compressed data stream into a second buffer implemented in the memory 102". The circuit 134" may be configured to (i) retrieve the compressed data stream from the second buffer and (ii) and transmit the compressed data bit-stream (e.g., as the signal BITSTREAM).

Figure 5:
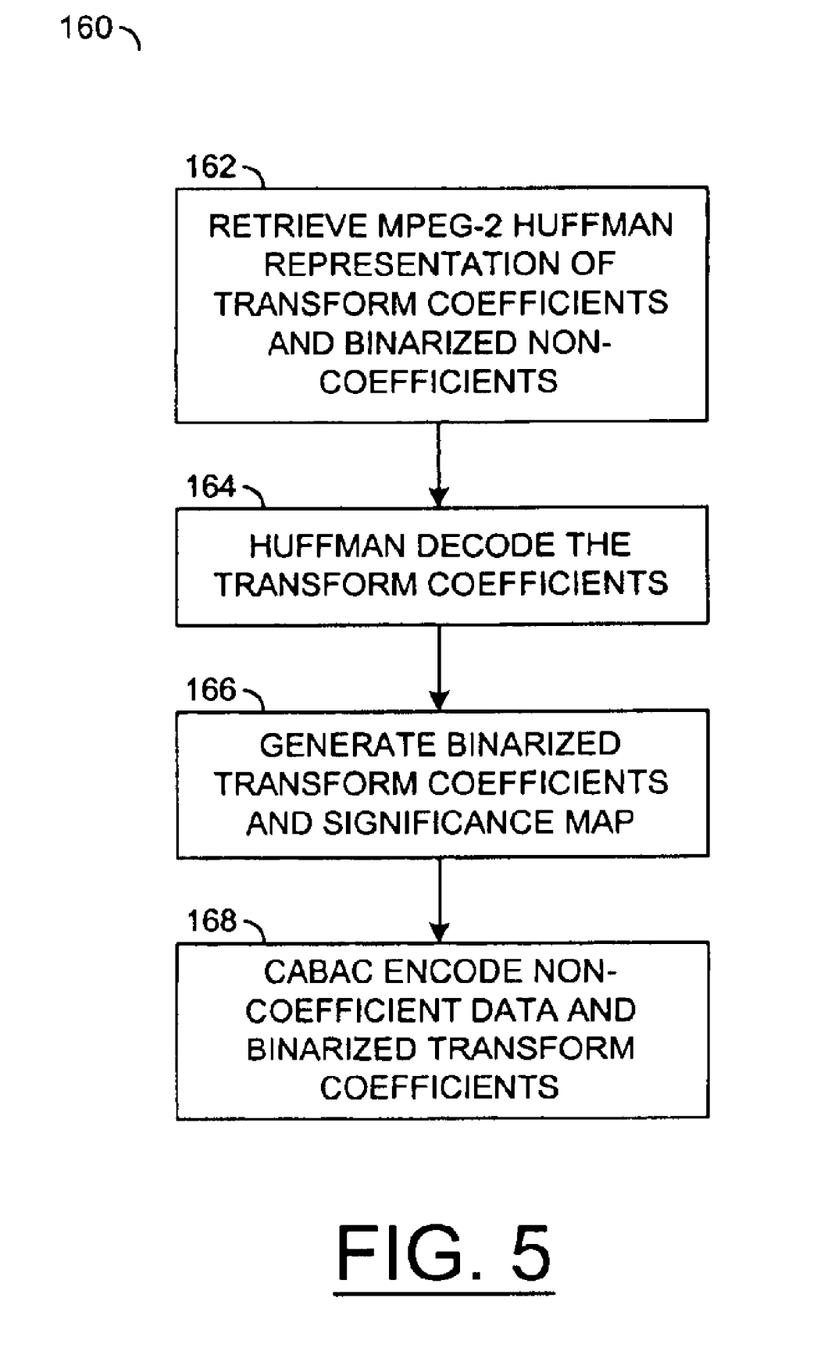
FIG. 5 is a flow diagram illustrating another example transcoding process in accordance with a preferred embodiment of the present invention.

Referring to FIG. 5, a flow diagram 160 illustrating an example encode operation of the circuit 132" of FIG. 4 is shown. A lossless entropy transcode process in accordance with the present invention may start by retrieving MPEG-2 Huffman representation of transform coefficients and binarized non-coefficient data from a buffer (e.g., the block 162). The encoded transform coefficients may be operated on by a Huffman decoder (e.g., the block 164). The decoded transform coefficients may be used to generate binarized transform coefficients and a significance map (e.g., the block 166). The binarized coefficients, the significance map and the non-coefficient data (e.g., motion vector differences, macroblock headers, etc.) may be encoded using a context based adaptive binary arithmetic (CABAC) encoder (e.g., the block 168). In an alternative embodiment, binarized data may be loaded directly into the block 168 and encoded using the CABAC encoder.

The encoder may first convert a fixed length symbol into a variable length binary representation referred to as variable length binarization. The variable length binary representation may be a Huffman code, where the representation of one symbol is generally not a prefix of another symbol. For example, in the compression of transform coefficients (e.g., up to 12 bits), using CABAC on the binary representation of the transform coefficients is generally not efficient. A detailed description of CABAC as used in H.264 may be found in the Joint Final Committee Draft of the Joint Video Specification (ITU-T Rec. H.264 ISO/IEC 14496-10 AVC), which is hereby incorporated by reference in its entirety. Instead, a two step process may be used. First, a significance map may be transmitted, describing which coefficients are zero and which are non-zero. Second, the coefficients may be transmitted as sign and absolute value.

Both the significance map and the coefficient absolute values may use variable length binarizations (or codes). For example, the absolute value of each coefficient may be coded as follows. When the absolute value (e.g., ABS) of the symbol is less than or equal to a predetermined value (e.g., 16), a corresponding binarization may be a string of ABS-1 ones followed by a zero. When ABS is greater than the predetermined value (e.g., 17, etc.), a corresponding binarization may be made up of two parts; (i) a prefix comprising a string of is and (ii) a suffix. The following TABLE 1 illustrates such a binarization:

TABLE 1

| Absolute value of coefficient | Binarization prefix | suffix |
|---|---|---|
| 1 | 0 | |
| 2 | 10 | |
| 3 | 110 | |
| 4 | 1110 | |
| 5 | 11110 | |
| 6 | 111110 | |
| 7 | 1111110 | |
| 8 | 11111110 | |
| 9 | 111111110 | |
| 10 | 1111111110 | |
| 11 | 11111111110 | |
| 12 | 111111111110 | |
| 13 | 1111111111110 | |
| 14 | 11111111111110 | |
| 15 | 111111111111110 | |
| 16 | 1111111111111110 | |
| 17 | 11111111111111110 | 0 |
| 18 | 11111111111111110 | 1 |
| 19 | 111111111111111110 | 00 |
| 20 | 111111111111111110 | 01 |
| 21 | 111111111111111110 | 10 |
| 22 | 111111111111111110 | 11 |
| 23 | 1111111111111111110 | 000 |
| 24 | 1111111111111111110 | 010 |

Breaking a block of coefficients into a significance map followed by sign and absolute value is generally a form of variable length (e.g., Huffman) compression. While this representation may take more bits than the direct (e.g., fixed length) binary representation of all coefficients, such a representation will generally be shorter when many coefficients are small. Similarly, using a variable length representation of ABS may use more bits than the direct binary representation. However, variable length representation of ABS may take less bits when the coefficients are generally small.

After converting symbols to the variable length binary representation, a CABAC encoder (or decoder) may compress (or decompress) the bits of the binarization using adaptive arithmetic codes. Specifically, each bit may be compressed (or decompressed) using arithmetic coding, where the probabilities for each bit may be estimated based on the values of previously encoded (or decoded) coefficients.

A real-time encoder or decoder may encode or decode one frame in an amount of time needed for one picture to be displayed. However, there may be many CABAC decodes needed for a single picture. For example, an H.264 main profile, level 4 (e.g., high definition) decoder may have a VBV (e.g., bit-stream) buffer size of 20,000,000 bits. A single picture, that may last as little as one-sixtieth of a second (e.g., one field), may contain 20,000,000 bits without overflowing the buffer. A conventional decoder capable of decoding such a picture in real time would need a decode rate of 1,200,000,000 bits per second. This is true even though the maximum compressed bit rate for level 4 is 20,000,000 bits per second, because a full second of bits may be packed into one picture.

In one example, more than one CABAC decode may be performed per compressed bit. For example, a ratio (e.g., RATIO(X)) may represent a number of CABAC decodes divided by a number of compressed bits over an interval X. A conventional real-time CABAC decoder must be able to decode at a rate of ratio(X)* 1,200,000,000 bits per second. For example, the ratio(X)~=1.3 for large X. In contrast, the present invention generally provides a two step transcoding architecture/process that allows the CABAC decoding to be performed at the average bit rate rather than the instantaneous bit rate.

The bits in one picture may be concentrated in a small part of the picture. A hardware decoder that has separate hardware units for CABAC decoding, forming predicted data, inverse quantization, etc., may actually need to be able to decode at a rate faster than RATIO(picture)*1,200,000,000 bits per second. The CABAC decoder may be idle or nearly idle while processing the parts of the picture that use very few bits.

When arithmetic coding is used, each bit is generally encoded or decoded in series. A processor that can perform a complete CABAC decode, including computing the context, in one cycle generally has a cycle rate of approximately 2 GHz to run in real-time. While this may be feasible, such a fast processor can be expensive and consume a lot of power.

The present invention may also provide an efficient mechanism for a single device that can efficiently decode different types of video data with different entropy representations with only hardware support for a more limited number of types of data. This may be beneficial even for formats that do not use arithmetic codes. For example, there are many existing video compression formats that use different Huffman codes. A Huffman decoder that operates at the peak bit rate in a picture may need hardware support, whereas a Huffman decoder that operates at the average bit rate may not. A lossless entropy transcoder may be used to transcode coefficient data from different Huffman formats into a single Huffman format (e.g., into MPEG-2 format). Then a real-time decoder may be used to decode the output of the lossless entropy transcoder using hardware support for MPEG-2 Huffman coefficient decoding.

The present invention generally provides an advantage for a real-time decoder. For example, when the maximum encoded bit rate is 20,000,000 bits per second and RATIO(1 second) is 1.3, the present invention may combine a transcoder configured to perform 26,000,000 CABAC decodes per second with a conventional decoder configured to decode a bit-stream with a simpler compression format. The present invention may provide an inexpensive, low power, low speed decoder IC that may operate in real time. The present invention may be employed in other binary arithmetic encoding applications, for example, audio compression and decompression.

While the invention has been particularly shown and described with reference to the preferred embodiments thereof, it will be understood by those skilled in the art that various changes in form and details may be made without departing from the spirit and scope of the invention.

What is claimed is:

1. A method for compressing/decompressing video data, comprising the steps of:

(A) translating a first representation of the video data compressed using context based adaptive binary arithmetic coding (CABAC) encoded symbols to a second representation of said video data compressed using non-CABAC entropy encoded symbols; and (B) translating said second representation of said video data to a third representation of said video data.

2. The method of claim 1, comprising the step of storing said second representation into a buffer.

3. The method of claim 1, further comprising the step of:
   storing each of said representations of said video data in a respective buffer.

4. The method of claim 1, wherein at least one of said representations of said video data comprises binarized symbols encoded with context-based adaptive binary arithmetic coding (CABAC).

5. The method according to claim 1, wherein:
   said third representation of said video data comprises a video stream.

6. The method according to claim 1, wherein:
   said first representation of said video data comprises a video stream;
   said second representation of said video data comprises non-CABAC entropy encoded symbols; and
   said third representation of said video data comprises CABAC encoded symbols.

7. The method according to claim 3, further comprising the steps of:
   storing said CABAC encoded symbols in a first buffer;
   storing said non-CABAC entropy encoded symbols in a second buffer; and
   presenting said video stream in real time.

8. The method according to claim 3, further comprising the steps of:
   storing said non-CABAC entropy encoded symbols in a first buffer;
   storing said CABAC encoded symbols in a second buffer; and
   presenting said CABAC encoded symbols in a bit-stream.

9. The method of claim 1 wherein:
   said first representation uses Huffman encoding;
   said second representation uses Huffman encoding; and
   said first representation and said second representation are not identical.

10. An integrated circuit for compressing/decompressing video data comprising:
    a first circuit configured to convert a first representation of said video data compressed using a first format into a second representation of said video data compressed using a second format; and
    a second circuit configured to convert said second representation of said video data into a third representation of said video data.

11. The apparatus of claim 10, wherein:
    said first representation uses context-based adaptive binary arithmetic coding (CABAC); and at least one symbol in said second representation comprises the output of the CABAC decoding process.

12. The apparatus of claim 10, wherein (i) said first and second circuits are contained on a single integrated circuit and (ii) said second representation is stored to an external memory device.

13. The integrated circuit according to claim 10, wherein said integrated circuit comprises a video decoder.

14. The integrated circuit according to claim 10, wherein said integrated circuit comprises a video encoder.

15. The integrated circuit according to claim 10, wherein said first circuit is configured to convert said video data from context-based adaptive binary arithmetic coding (CABAC) to non-CABAC entropy coding.

16. The integrated circuit according to claim 10, wherein said second circuit is configured to convert said video data from non-CABAC entropy coding to uncompressed video data.

17. The integrated circuit according to claim 10, wherein said integrated circuit is configured to store said first and second representations of said video data in a first and a second external buffer, respectively.

18. The integrated circuit according to claim 10, further comprising a third circuit configured to capture a bit-stream comprising said first representation of said video data and store said first representation of said video data in a first buffer.

19. The integrated circuit according to claim 10, further comprising a third circuit configured to transmit a bit-stream comprising said third representation of said video data.

20. The integrated circuit according to claim 10, wherein said integrated circuit comprises a real-time video decoder/decompressor configured to decode/decompress a context-based adaptive binary arithmetic encoded bit-stream in real time at an average bit rate of the bit-stream.

21. The integrated circuit according to claim 10, wherein:

said first representation uses Huffman encoding;

said second representation uses Huffman encoding; and said first representation and said second representation are not identical.

22. A method for compressing/decompressing video data, comprising the steps of:

(A) translating a first representation of said video data comprising CABAC encoded symbols to a second representation of said video data comprising non-CADAC entropy encoded symbols; and (B) translating said second representation of said video data to a third representation of said video data comprising a video stream.

* * * * *